United States Patent
Choi et al.

(10) Patent No.: US 7,517,431 B2
(45) Date of Patent: Apr. 14, 2009

(54) SPINNING APPARATUS

(75) Inventors: Ho-Jin Choi, Gyeonggi-do (KR); Yong-Mok Kim, Gyeonggi-do (KR); Ju-Bae Kim, Gyeonggi-do (KR); Byoung-Jin Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 176 days.

(21) Appl. No.: 11/253,773

(22) Filed: Oct. 18, 2005

(65) Prior Publication Data

US 2006/0081338 A1    Apr. 20, 2006

(30) Foreign Application Priority Data

Oct. 19, 2004    (KR)    ........................ 10-2004-0083584

(51) Int. Cl.
*H01L 21/027* (2006.01)
(52) U.S. Cl. .................. 156/345.55; 134/153; 134/157
(58) Field of Classification Search ........... 156/345.55, 156/345.21; 134/148, 153, 157, 119, 134, 134/902, 140; 118/730; 269/21
See application file for complete search history.

(56) References Cited

U.S. PATENT DOCUMENTS

| | | | |
|---|---|---|---|
| 5,126,029 A * | 6/1992 | Tomer et al. ........... 204/192.12 |
| 6,401,734 B1 * | 6/2002 | Morita et al. ............... 134/153 |
| 6,533,864 B1 * | 3/2003 | Matsuyama et al. ......... 118/704 |
| 6,964,724 B2 * | 11/2005 | Yamasaki et al. ...... 156/345.21 |
| 2003/0213772 A9 | 11/2003 | Mok et al. |
| 2004/0211365 A1 * | 10/2004 | Yamaguchi .................. 118/728 |
| 2006/0054091 A1 * | 3/2006 | Speciale et al. ............. 118/730 |

FOREIGN PATENT DOCUMENTS

| | | |
|---|---|---|
| KR | 2000-269178 | 9/2000 |
| KR | 2002-0037858 | 5/2002 |
| KR | 2005-0053244 | 6/2005 |

OTHER PUBLICATIONS

English language abstract of Korean Publication No. 2000-269178.
English language abstract of Korean Publication No. 2002-0037858.

* cited by examiner

*Primary Examiner*—Sylvia R. MacArthur
(74) *Attorney, Agent, or Firm*—Marger Johnson & McCollom, P.C.

(57) ABSTRACT

In an embodiment, a spinning apparatus includes a spin table on which an object to be etched is placed, a rotation unit rotating the spin table, and a nozzle unit including a center nozzle, disposed on the central portion of the spin table, and at least one side nozzle, disposed on an edge of the spin table. Etching uniformity is improved over the conventional art because an etching chemical is distributed more evenly by the nozzle unit as the object to be etched is rotated. An embodiment may also include an exhaust to remove excess etching chemical.

18 Claims, 3 Drawing Sheets

SPINNING APPARATUS

This application claims the benefit of Korean Patent Application No. 10-2004-0083584, filed on Oct. 19, 2004, in the Korean Intellectual Property Office, the disclosure of which is incorporated herein in its entirety by reference.

BACKGROUND OF THE INVENTION

1. Field of the Invention

The present invention relates to a spinning apparatus, and more particularly, to a spinning apparatus for wet-etching a wafer.

2. Description of the Related Art

Generally, wet etching can be performed using wet benches, which are used to wet etch a plurality of wafers at the same time, or single water processors, which are used to wet etch one wafer at a time. Wet benches or batch wafer cleaners can process a large quantity of wafers, but, unfortunately, they occupy large areas. Also, when problems occur in the etching process, it is very likely that an entire batch of the wafers will have defects.

On the other hand, while single wafer processors require a long time to etch many wafers, they occupy a small area. Also, even when problems occur in the etching process, only one wafer is affected. Therefore, single wafer processors have become more prevalent than wet benches.

The most common form of the single wafer processor is a spinning apparatus.

FIG. 1 is a perspective view of a conventional spinning apparatus, and FIG. 2 is a plan view of the spinning apparatus of FIG. 1.

Referring to FIGS. 1 and 2, the conventional spinning apparatus includes a spin table 1 on which a wafer is placed, and a rotation unit 3 used to rotate the spin table 1. A back nozzle 5 to spray an etching chemical into a backside of the wafer is disposed in the center of the spin table 1. A plurality of fixing pins 2 are disposed on an edge of the spin table 1 to fix the wafer.

The rotation unit 3 includes a motor (not shown) used as a driving source, and a rotation shaft 4 providing a torque produced by the motor to the spin table 1.

In the conventional spinning apparatus, the amount of etching chemical sprayed to the backside of the wafer varies from region to region on the wafer. This causes a problem of a non-uniformly etched wafer backside.

In addition, the entire spin table 1 of the conventional spinning apparatus rotates, making it difficult to apply an etching chemical to a bevel of the wafer. Thus the bevel of the wafer cannot be easily etched.

SUMMARY OF THE INVENTION

The present invention provides a spinning apparatus that can etch a backside of a wafer uniformly.

The present invention also provides a spinning apparatus that can easily etch a bevel of a wafer.

According to an embodiment of the present invention, a spinning apparatus includes a spin table on which an object to be etched, such as a wafer, is placed. A rotation unit rotates the spin table. A nozzle unit dispenses an etching chemical to a lower surface of the object. The nozzle unit includes a center nozzle disposed at a central portion of the spin table, and at least one side nozzle disposed at an edge of the spin table.

A vacuum chuck unit may be disposed on the spin table so that the object to be etched is held by a vacuum.

The spin table may include a fixed table having an annular opening and a rotation table having the vacuum chuck unit formed inside the annular opening. A nozzle unit may be disposed on the fixed table. The rotation table may rotate with respect to the fixed table.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
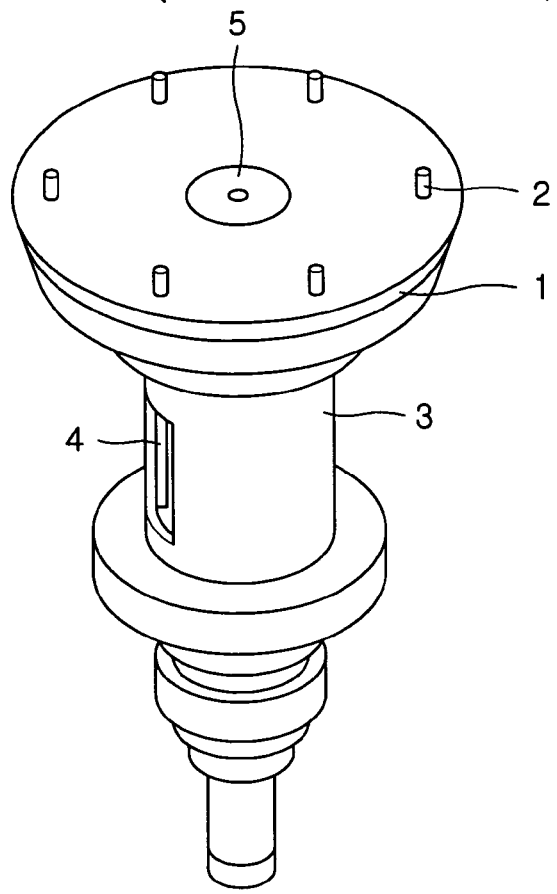
FIG. 1 is a perspective view of a conventional spinning apparatus.
Figure 2:
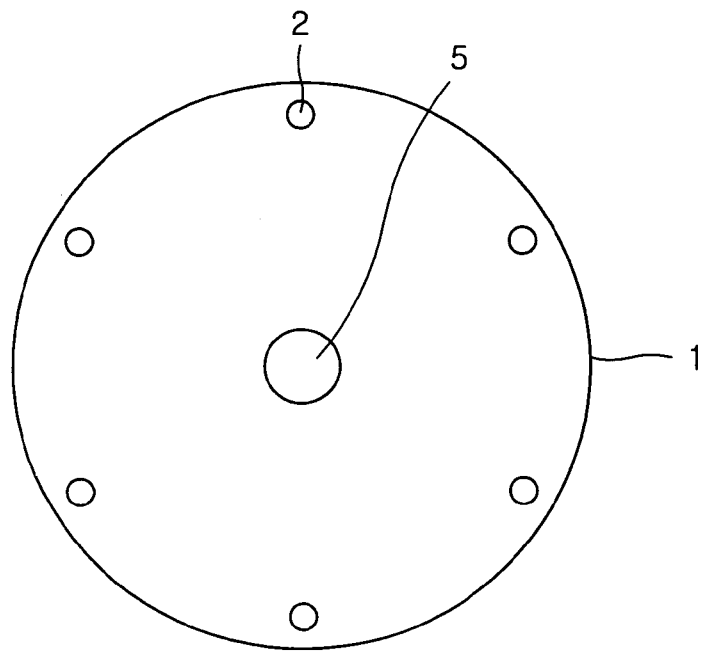
FIG. 2 is a plan view of the spinning apparatus of FIG. 1.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will not be repeated.

Figure 3:
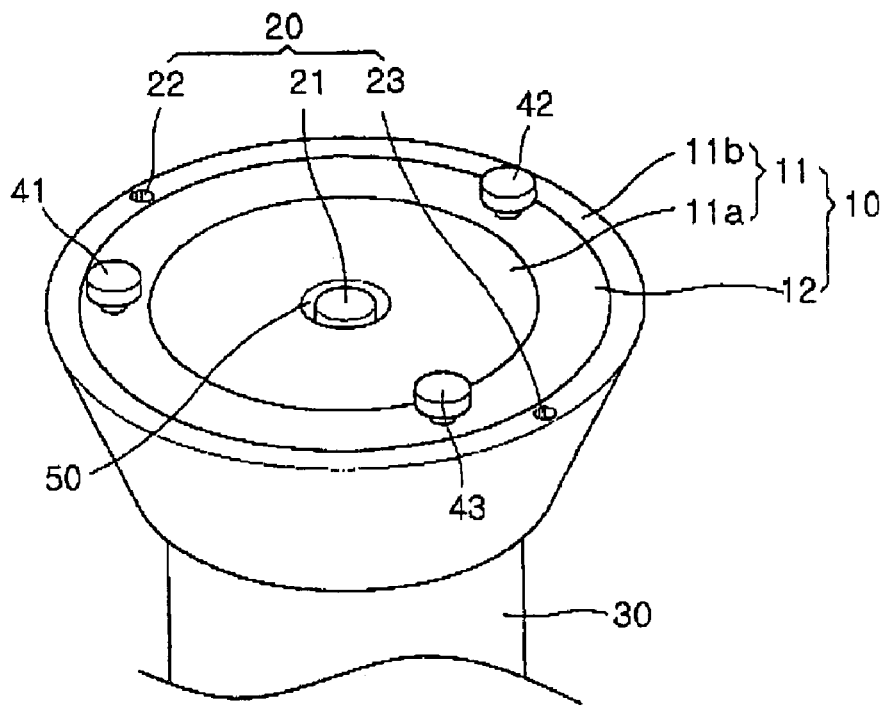
FIG. 3 is a perspective view of a spinning apparatus according to an exemplary embodiment of the present invention.
Figure 4:
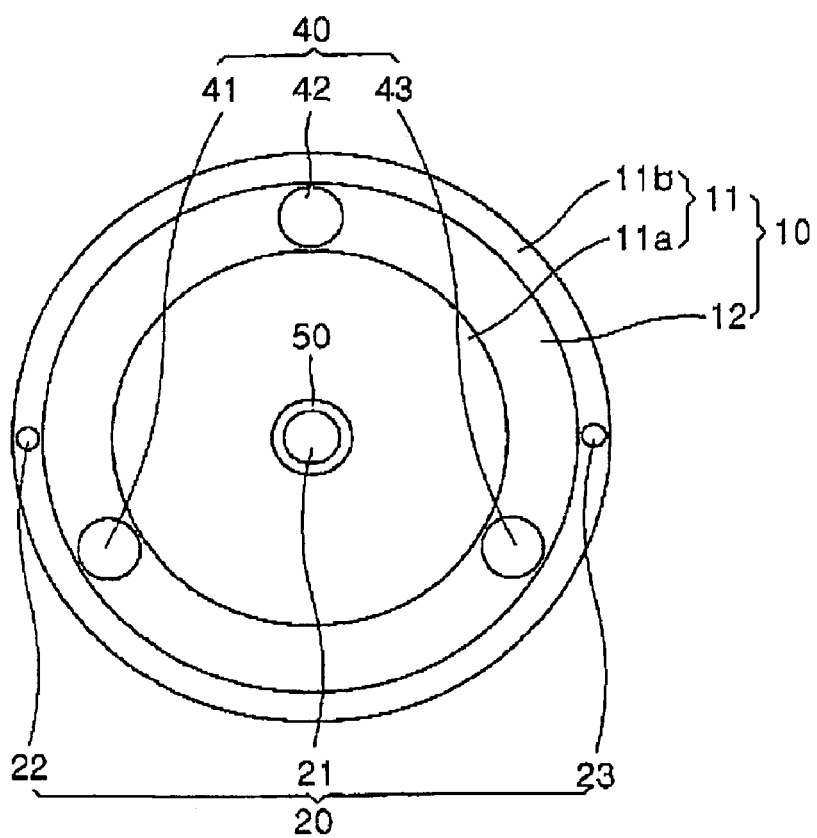
FIG. 4 is a plan view of the spinning apparatus of FIG. 3.
Figure 5:
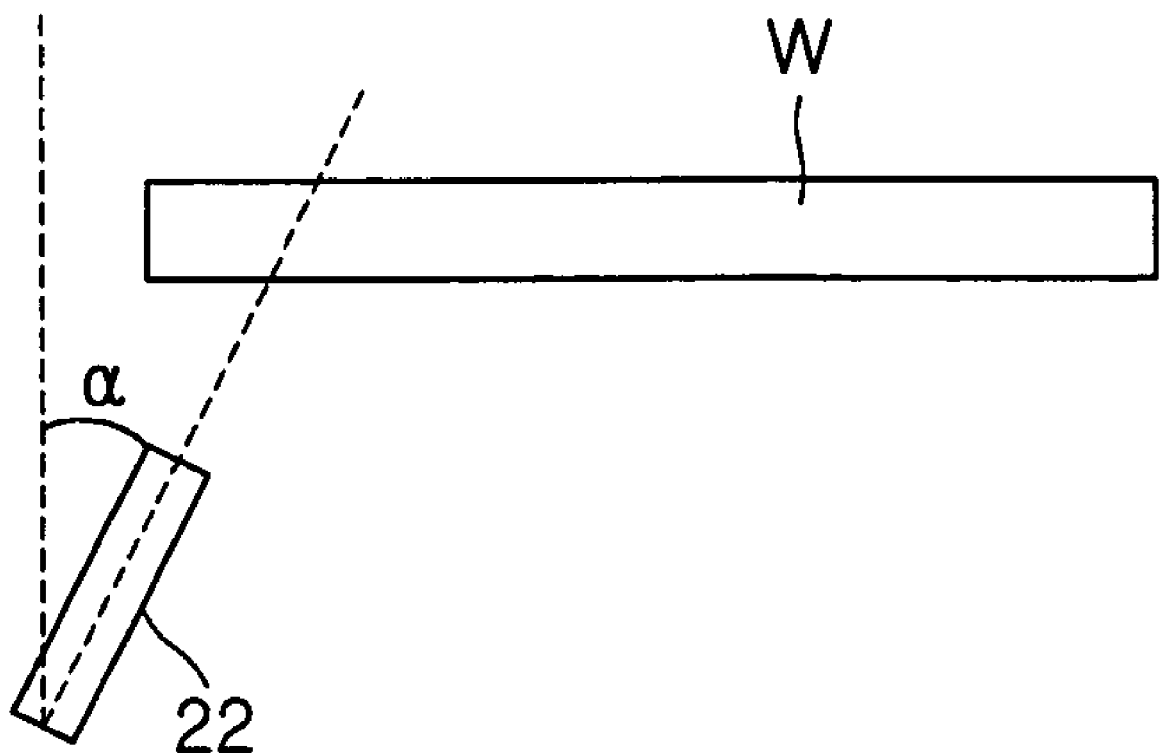
FIG. 5 is a cross-sectional view showing a geometric relation between a side nozzle and a wafer for the spinning apparatus of FIG. 3.

An embodiment of the present invention is shown in FIGS. 3 through 5. In this embodiment a spinning apparatus includes a spin table 10 on which an object to be etched, such as the wafer W, is placed. A rotation unit 30 rotates the spin table 10. A nozzle unit 20 dispenses an etching chemical onto a backside of the wafer W.

The spin table 10 includes a fixed table 11 and a rotation table 12. The fixed table 11 further includes an inner portion 11a and an outer portion 11b. Both the inner and outer portions 11a and 11b are circular areas, and the inner portion 11a is concentrically within the outer portion 11b. The rotation table 12 is concentrically disposed between the inner portion 11a and the outer portion 11b of the fixed table 11. The rotation table 12 can rotate with respect to both the inner and outer portions 11a and 11b. The rotation table 12 is connected to the rotation unit 30 and torque is transferred from the rotation unit 30 to the rotation table 12.

The rotation unit 30 includes a driving source (not shown) and a rotation shaft (not shown) conveying the torque of the driving source to the rotation table 12. The driving source may be a motor, a cylinder, a gear structure, or the like.

The nozzle unit 20 includes a center nozzle 21 and two side nozzles 22 and 23. Another embodiment may also include one or more than two side nozzles. The center nozzle 21 and the side nozzles 22 and 23 are connected to an etching chemical container (not shown). The center nozzle 21 is disposed in the central portion of the fixed table 11 and dispenses the etching chemical onto a central portion of the backside of the wafer W.

The side nozzles 22 and 23 are disposed at an edge of the fixed table 11 and dispense the etching chemical onto an edge of the backside of the wafer W. In this embodiment, the angle between the side nozzles 22 and 23 around the fixed table is about 180°. In another embodiment, this angle may vary with the number of side nozzles. As is shown in FIG. 5, the side nozzles 22 and 23 are sloped so that they make predetermined acute angles with an axis perpendicular to a surface of the wafer W. The axes of the side nozzles 22 and 23, that is, the direction in which the etching chemical is sprayed may make an angle α of 20° to 40° with the axis perpendicular to the surface of the wafer W. In an embodiment with three side nozzles, The side nozzles are disposed at about 120° intervals. In an embodiment with four side nozzles, the side nozzles are disposed at about 90° intervals. That is, the side nozzles are disposed at regular intervals.

A vacuum chuck unit 40 is disposed on the rotation table 12. The vacuum chuck unit 40 forms a vacuum below the wafer W, thus fixing the wafer W to an upper surface of the rotation table 12. The vacuum chuck unit 40 is connected to a vacuum source (not shown), such as a vacuum pump. The vacuum chuck unit 40 is composed of vacuum chucks 41, 42, and 43. The vacuum chucks 41, 42, and 43 are disposed at about 120° intervals. In another embodiment there may be any number of vacuum chucks. In particular, when there is more than one vacuum chuck, the vacuum chucks are preferably disposed at regular intervals.

An exhaust port 50 may be formed in the fixed table 11 to exhaust the residual etching chemical. The exhaust port 50 may be formed in the central portion of the fixed table 11. In particular, the exhaust port 50 may surround the center nozzle 21. In other words, the center nozzle 21 may be positioned inside the exhaust port 50.

In the present embodiment, a wafer is used as an object to be etched. However, other objects, such as a glass substrate used for LCD devices, can also be used as the object to be etched.

An etching process performed on a backside of a wafer using the spinning apparatus will now be described.

When a wafer W is placed on a spin table 10, a vacuum source forms a vacuum below the wafer W through a vacuum chuck unit 40. Therefore, the wafer W is fixed to the rotation table 12.

The rotation table 12 is rotated by the rotation unit 30 and the wafer W rotates with the rotation table 12. In this embodiment the rotation table 12 preferably rotates at about 3,000 rpm.

An etching chemical is dispensed from the center nozzle 21 and the side nozzles 22 and 23 onto the backside of the rotating wafer W. The etching chemical dispensed from the center nozzle 21 reaches a central portion of the backside of the wafer W. The etching chemical dispensed from the side nozzles 22 and 23 reaches an edge of the backside of the wafer W. The etching chemical dispensed from the center nozzle 21 and the side nozzles 22 and 23 can reach the entire backside of the wafer W uniformly because the dispensing is performed as the wafer W rotates. In particular, since the side nozzles 22 and 23 are slanted with respect to the backside of the wafer W, the etching chemical dispensed from the side nozzles 22 and 23 is sprayed from the edge of the backside of the wafer W to the central portion of the backside of the wafer W.

Therefore, since the etching chemical is uniformly dispensed onto the entire backside of the wafer W, the backside of the wafer is uniformly etched. In addition, since the wafer W is fixed by a vacuum, there are no barriers, such as edge clamps, retaining clips, or the like, to prevent the etching chemical from reaching a bevel of the wafer. A sufficient supply of the etching chemical to the bevel of the wafer W results in a simplification of the etching of the bevel of the wafer W.

After the backside of the wafer W is etched, the residual etching chemical is exhausted to the outside of the spinning apparatus through the exhaust port 50.

According to the present invention, as described above, a nozzle unit is composed of a center nozzle and side nozzles so that an etching chemical is sufficiently provided to a backside of the wafer. Therefore, the backside of the wafer can be uniformly etched.

In addition, since the wafer is fixed by a vacuum, the etching chemical is sufficiently provided to a bevel of the wafer. Therefore, the bevel of the wafer can be easily etched.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A spinning apparatus comprising:
a rotation table adapted to hold an object to be etched;
a rotation unit arranged and structured to rotate the rotation table;
a fixed table including an inner portion and an outer portion, with the rotation table disposed between the inner portion and the outer portion; and
a nozzle unit having a center nozzle disposed at a central area of the fixed table, and at least one side nozzle disposed at an edge of the outer portion of the fixed table, the nozzle unit adapted to dispense an etching chemical to a lower surface of the object to be etched.

2. The spinning apparatus of claim 1, wherein for the fixed table the inner portion is concentrically within the outer portion with the rotation table concentrically disposed between the inner portion and the outer portion, and the rotation table is adapted to rotate with respect to the fixed table.

3. The spinning apparatus of claim 1, further comprising a vacuum chuck unit that is disposed on the rotation table to fix the object to be etched to the rotation table.

4. The spinning apparatus of claim 3, wherein the vacuum chuck unit comprises two or more vacuum chucks, each disposed at equal angular intervals on the rotation table.

5. The spinning apparatus of claim 1, wherein the at least one side nozzle is two or more side nozzles, each disposed at equal intervals on the outer portion of the fixed table.

6. The spinning apparatus of claim 1, wherein the etching chemical is dispensed from the at least one side nozzle at an acute angle from an axis perpendicular to a surface of the fixed table.

7. The spinning apparatus of claim 6, wherein the acute angle is in the range of 20° to 40°.

8. The spinning apparatus of claim 1, wherein an exhaust port to exhaust the etching chemical is formed in the fixed table.

9. The spinning apparatus of claim 1, wherein the object to be etched is a wafer.

10. A spinning apparatus comprising:
a spin table comprising a fixed table having an annular opening between an inner portion and an outer portion, and a rotation table that is disposed inside the annular opening and is adapted to rotate with respect to the fixed table, the spin table to etch an object placed on the spin table;

a vacuum chuck unit disposed on the rotation table to form a vacuum below the object to be etched;

a rotation unit adapted to rotate the rotation table; and a nozzle unit comprising a center nozzle disposed at a central portion of the spin table, and at least one side nozzle disposed at an edge of the outer portion of the spin table, the nozzle unit adapted to dispense an etching chemical to a lower surface of the object to be etched.

11. The spinning apparatus of claim 10, wherein the vacuum chuck unit comprises two or more vacuum chucks, each disposed at equal angular intervals on the rotation table.

12. The spinning apparatus of claim 10, wherein the at least one side nozzle is two or more side nozzles, each disposed at equal intervals on the outer portion of the fixed table.

13. The spinning apparatus of claim 10, wherein the etching chemical is dispensed from the at least one side nozzle at an acute angle from an axis perpendicular to a surface of the fixed table, wherein the acute angle is in the range of 20° to 40°.

14. The spinning apparatus of claim 10, wherein an exhaust port used to exhaust the etching chemical is formed in the fixed table.

15. A spinning apparatus comprising:

a spin table comprising a fixed table having an annular opening between an inner portion and an outer portion of the fixed table, and a rotation table that is disposed inside the annular opening and is adapted to rotate with respect to the fixed table, the spin table adapted to etch an object placed on the rotation table;

a rotation unit adapted to rotate the rotation table; and a nozzle unit to dispense an etching chemical onto a lower surface of the object to be etched.

16. The spinning apparatus of claim 15, further comprising a vacuum chuck unit that is disposed on the rotation table and forms a vacuum below the object to be etched so that the object to be etched is fixed to the rotation table.

17. The spinning apparatus of claim 15, wherein an exhaust port used to exhaust the etching chemical is formed in the fixed table.

18. The spinning apparatus of claim 10, the inner portion being concentrically within the outer portion, with the rotation table concentrically disposed between the inner portion and the outer portion.

* * * * *